United States Patent [19]

Yee

[11] 4,099,149

[45] Jul. 4, 1978

[54] SINGLE SIDE BAND MONOLITHIC CRYSTAL FILTER

[75] Inventor: Henry Kai-Hen Yee, Montreal, Canada

[73] Assignee: Northern Telecom Limited, Montreal, Canada

[21] Appl. No.: 789,267

[22] Filed: Apr. 20, 1977

[51] Int. Cl.² .................. H03H 9/26; H03H 9/32; H03H 9/20; H03H 9/04
[52] U.S. Cl. .................................. 333/72; 310/320
[58] Field of Search ............... 333/70 R, 71, 72, 74; 310/320; 331/107 A

[56] References Cited

U.S. PATENT DOCUMENTS

| 2,248,776 | 7/1941 | Och ........................... 333/72 |
| 3,564,463 | 2/1971 | Beaver et al. ................ 333/72 |
| 3,944,951 | 3/1976 | Kurth .......................... 333/72 |

Primary Examiner—Alfred E. Smith
Assistant Examiner—Marvin Nussbaum
Attorney, Agent, or Firm—Achmed N. Sadik

[57] ABSTRACT

An improved monolithic piezoelectric bandpass filter unit, suitable for single side band applications, having a pair of finite poles introduced into one of its stopbands.

6 Claims, 10 Drawing Figures

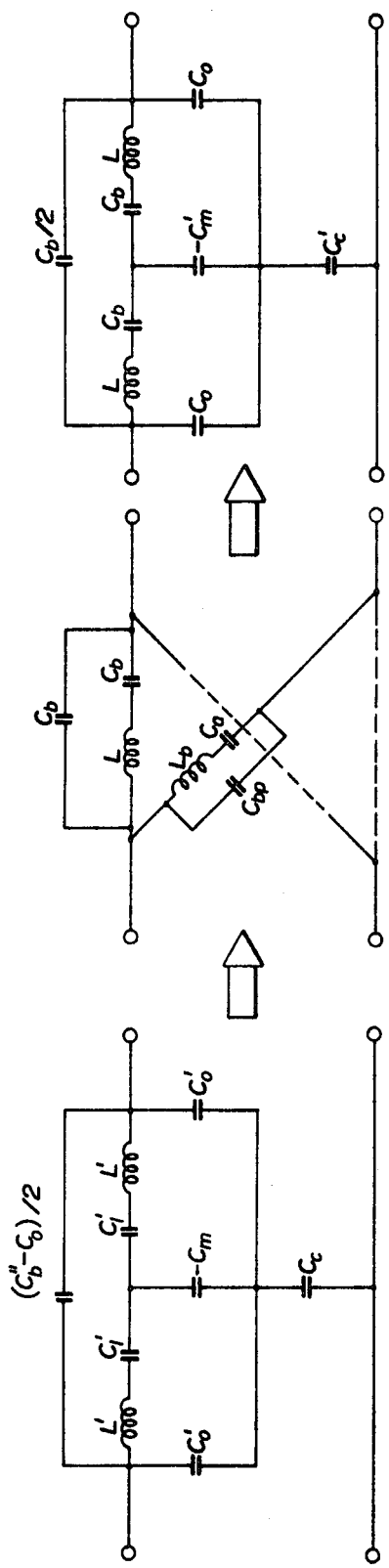
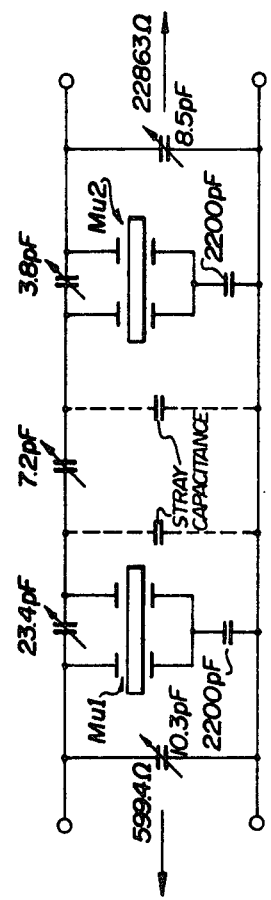
FIG. 6
FIG. 8

SINGLE SIDE BAND MONOLITHIC CRYSTAL FILTER

FIELD OF THE INVENTION

The present invention relates to crystal filters in general and to those utilizing monolithic crystals in particular.

BACKGROUND AND PRIOR ART OF THE INVENTION

Copending application Ser. No. 681,438, filed Apr. 29, 1976, now U.S. Pat. No. 4,028,647, in the name of H. K. H. Yee as inventor, discloses an improved monolithic piezoelectric filter unit having two bilateral electrodes on one surface and a common electrode on the opposite surface with the common electrode connected to the common terminal of the filter unit via a capacitor ($C_c$). The latter, in cooperation with the coupling between the two bilateral electrodes, introduces a pair of finite poles one in each of the upper and the lower stopbands on either side of the passband of the filter unit. An advantage of such arrangement is that the tolerance on the internal coupling coefficient of the monolithic crystal may be relaxed.

In utilizing monolithic crystals to realize Single Side Band (SSB) filters, it is advantageous to have all finite poles in either of the upper or lower stopbands exclusively, depending on which sideband is involved.

SUMMARY OF THE INVENTION

In the above-mentioned copending application, the capacitor $C_c$ connecting the common electrode of the monolithic crystal to the common terminal of the filter unit introduces a pair of finite poles one on either side of the passband. It has been found that, instead, this capacitor could be used to virtually cancel the intra-crystal coupling with the following resultant advantages:

(1) introduction of a pair of finite poles, both of which are either in the upper or lower stopbands;

(2) further relaxation of the tolerance on the intra-crystal coupling, which is now almost fully cancelled; and (3) permitting the design of a simpler filter having adequate performance for the given application.

In case both finite poles are to be in the lower stopband, the capacitor $C_c$ would be unusually large in capacitance value. If both finite poles are in the upper stopband, the capacitor $C_c$ would be unusually small in value. The term "unusually" large or small will become clearer when describing the preferred embodiment of the present invention.

In essence, the novel filter unit permits the use of a monolithic two pole crystal to replace two discrete crystal resonators.

Thus according to the present invention, the novel monolithic bandpass filter unit has an upper and a lower stopband and comprises: a monolithic piezoelectric crystal substrate having two adjacent electrodes on one surface thereof constituting two bilateral terminals of said filter unit, and a common electrode on the other surface opposite said two electrodes; a coupling capacitor between said two adjacent electrodes; and a capacitor interconnecting said one common electrode and a common terminal of said filter unit and having a predetermined capacitance value to substantially cancel intra-crystal coupling in said monolithic piezoelectric crystal substrate, and to introduce a pair of finite poles in only one of the upper and the lower stopband of the filter unit.

BRIEF DESCRIPTION OF THE DRAWINGS

A preferred embodiment of the present invention will now be described in conjunction with the accompanying drawings in which:

FIG. 6 is a further development of the sections of FIG. 5 ending with the equivalent circuit of the monolithic filter unit in accordance with the present invention;

FIG. 8 is a final composite filter according to the present invention.

DETAILED DESCRIPTION OF THE PREFERRED EMBODIMENT

Figure 1A:
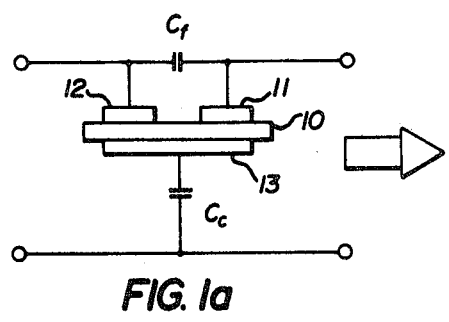
FIG. 1a depicts a monolithic filter unit.
Figure 1B:
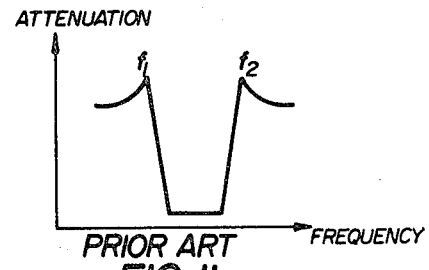
FIG. 1b is a qualitative representation of a pair of finite poles of the monolithic filter unit of FIG. 1a according to the prior art.
Figure 1C:
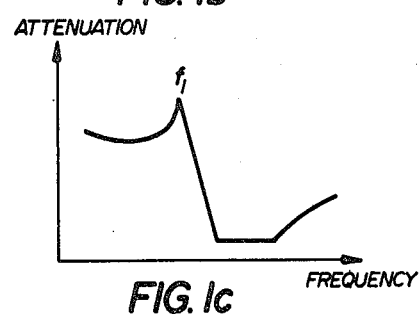
FIG. 1c is a qualitative representation of a pair of finite poles at the frequency $f_1$ introduced by the monolithic filter unit of FIG. 1a according to the present invention.

FIG. 1a of the drawings depicts schematically the structure of a monolithic filter unit. In the prior art referred to above, the intra-crystal coupling and the capacitors $C_b$ and $C_c$ were utilized to produce two finite poles at the frequencies $f_1$ and $f_2$ as shown in FIG. 1b of the drawings. In the present invention, however, the capacitor $C_c$ is utilized solely to substantially cancel intra-crystal coupling, and to cause the single AT cut monolithic crystal 10, with the thereon deposited electrodes 11, 12 and 13, to act as a substitute for two single crystal resonators coupled via the capacitor $C_b$. As a result, two finite poles as shown in FIG. 1c at the same frequency $f_1$ are produced. Such two finite poles at the same side of the passband (in FIG. 1c the lower frequency side) are suitable for Single Side Band (SSB) filters, and permit the design of simpler filters with adequate performance.

It is in order here to point out that a single crystal cut to have inherently very little or no intra-crystal coupling is not suitable for many applications, because such cuts are only suitable for low frequency operation. In addition, the maximum practicable bandpass width is only ca. 0.3% of the operating frequency, so that, for instance, a crystal filter at 100 KHz is capable of only ca. 0.3 KHz band-pass width. This is insufficient for many applications.

Beginning with FIG. 2, a step by step design procedure for a composite filter with finite poles only in the lower stopband according to the present invention, will be described.

Figure 2:
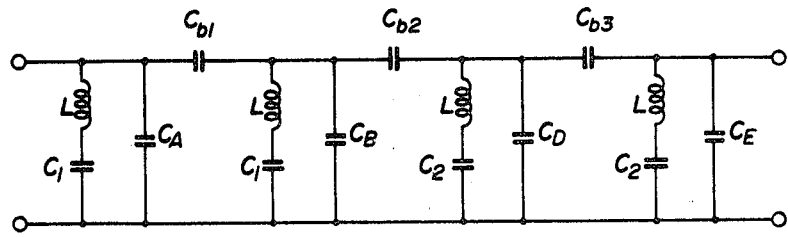
FIG. 2 is a conventional SSB filter with finite poles only in the lower stopband designed by insertion loss synthesis as the first step in designing a filter in accordance with the present invention.

FIG. 2 is the schematic of a conventional insertion loss synthesized SSB filter having two adjacent pairs of identical pole frequencies $f_1$ and $f_2$ (FIG. 1c shows only one pair $f_1$ — usually $f_2$ would be only slightly lower than $f_1$ as will be shown in a numerical example, infra). The schematic shown has identical inductances, which is achievable by capacitance transformation. Such filter design is well known and is described, for instance, in "Filter Design Using Transformed Variables" by H. J. Orchard in IEEE Transactions on Circuit Theory, Dec. 1968, pp. 385–407, and in "On The Design of Filters by Synthesis" by R. Saal and E. Ulbrich in IRE Transactions on Circuit Theory, Dec. 1958, pp. 284–327.

Figure 3:
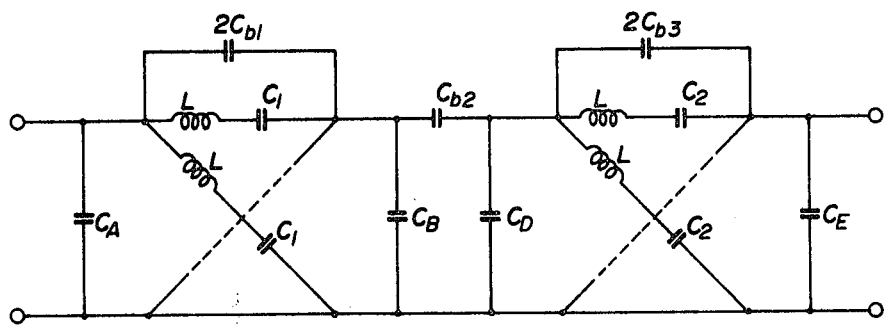
FIG. 3 is the lattice equivalent of the filter in FIG. 2.

The filter of FIG. 2 is converted into its lattice equivalent shown in FIG. 3. Such conversion needs no further explanation as it is clear from the two figures.

Figure 4:
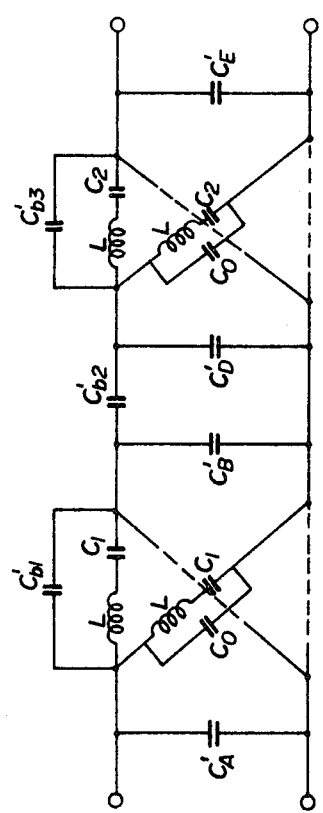
FIG. 4 is the circuit of FIG. 3 including the crystal static capacity $C_o$.

In order to take the crystal static capacity $C_o$ in consideration, the lattice circuit of FIG. 3 is modified into that of FIG. 4. In FIG. 4 the primed capacitors $C_{b1}'$, $C_{b3}'$, $C_A'$, $C_B'$, $C_D'$ and $C_E'$ are given by:

$$C_{b1',3} = 2C_{b1,3} + C_o$$

and $$C_{A,B,D,E}' = C_{A,B,D,E} - C_o.$$

Since it is desired to obtain the lowest possible coupling within the crystal, the two electrodes 11 and 12 would be placed as far apart as possible. This, of course, is limited by the size of the crystal 10 and its quality factor Q. The actual "residual" coupling must then be determined to a reasonable accuracy, either by measuring or calculation and preferably by both. This coupling may be represented by a capacitance value $C_m$.

Figure 5:
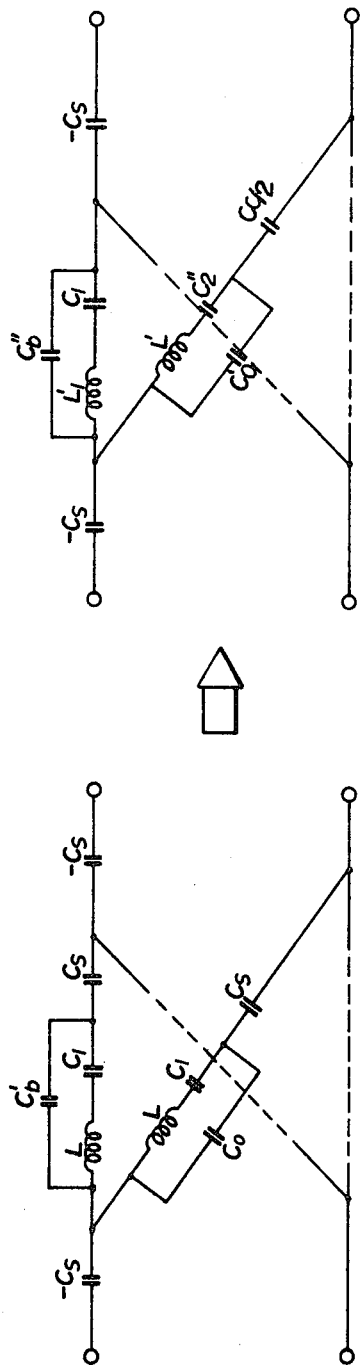
FIG. 5 is a further development of sections of the circuit of FIG. 4 incorporating the series capacitance $C_s$ and is subsequently transferred into the capacitance $C_s/2$.

Given $C_m$, the left-hand lattice section in FIG. 5 (corresponding to each of the lattice sections in FIG. 4) in which $C_s$ and $-C_s$ have been introduced, is determined. $C_s$ is given by:

$$\frac{C_m}{2}\left(1 - \frac{C_{b1,3}'}{C_o}\right)$$

The right-hand lattice section in FIG. 5 is then determined by absorbing $C_s$ into the series arm tuned circuit to produce $L'$, $C_1'$ and $C_b''$. In the shunt arm a portion of $C_s$ is absorbed into the tuned circuits to yield the same inductance $L'$ as in the series arm, with the remainder series capacitance being $C_c/2$. $C_c$ is actually very close in magnitude to $C_m$ but opposite in sign. Of course, circuit transformations such as those of absorbing capacitance etc. are standard in the art, and are given, for example, in the "Handbook of Filter Synthesis" by Anatol I. Zverev, published 1967 by John Wiley and Sons, Inc. (cf. p. 526–527 for an example calculation).

From the lattice section (excluding for the moment, $-C_s$) of FIG. 5 the first bridged T section in FIG. 6 is obtained (the component values are related as shown). $-C_s$ is then absorbed by capacitance transformation and the bridged T section is transformed into the lattice section in FIG. 6, which also contains the denormalized inductance L instead of $L'$. The denormalization is accomplished by impedance scaling and capacitance transformation. Now the lattice section is again transformed into its bridged T equivalent as shown in FIG. 6. The values of the capacitors in FIG. 6 are as follows:

$$C_{bp} = \sqrt{\frac{L}{L_b}}\, C_o$$

$$C_m = \frac{2\, C_a C_b}{(C_a - C_b)} \text{ and}$$

$$C_c = \frac{2\, C_o}{\sqrt{\frac{L_b}{L}} - 1}$$

Generally speaking, the final value of $C_m'$ may deviate slightly from the original design value $C_m$ by an error in the order of 0.1%, which is acceptable and is compensated by adjustment of the capacitor $C_b$.

Numerical Example

A numerical example for a filter suitable for a channel bank according to the following requirements will now be given:

| | |
|---|---|
| Passband Ripple | 0.1 dB peak-to-peak |
| Passband | 8,140,250 Hz to 8,143,400 Hz |
| 2 pole frequencies at | 8137.0 KHz |
| 2 pole frequencies at | 8139.2 KHz |
| Predistorted filter width | |
| Crystal Q | 100,000 |

Based on the above specifications a ladder network is synthesized having equal inductances. The inductance, of course, is a crystal parameter which is determined by the approximate frequency of operation. This also determines the other crystal parameters, which could be as follows:

| | |
|---|---|
| Crystal inductance L | = 24 mH |
| Static Capacity $C_o$ | = 3.2 pF |
| Plate Size (diameter) | = 0.560 inch |
| Coupling $C_m$ | = −2200 pF ± 1% |

The ladder network values designated by the symbols in accordance with FIG. 2 are as follows:

| | |
|---|---|
| L | = 24.00 mH |
| $C_1$ | = 0.015931826 pF |
| $C_2$ | = 0.01590404432 pF |
| $C_{b1}$ | = 23.550085 pF |
| $C_{b2}$ | = 7.2825777 pF |
| $C_{b3}$ | = 3.8442388 pF |
| $C_A$ | = 13.52966 pF |
| $C_B$ | = 3.347053 pF |
| $C_D$ | = 3.760389 pF |
| $C_E$ | = 11.83077 pF |

The impedance of the left-hand port is 594.943 ohms, and that of the right-hand port is 22528.0 ohms.

The ladder network is converted into its equivalent lattice network, and then the crystal static capacity $C_o$ is included ending with the configuration shown in FIG. 4 with the following values:

| | |
|---|---|
| L | = 24.00 mH |
| $C_o$ | = 3.2 pF |
| $C_1$ | = 0.015931824 pF |
| $C_2'$ | = 0.01590404432 pF |
| $C_{b1}$ | = 50.3001707 pF |
| $C_{b2'}$ | = 7.2825777 pF |
| $C_{b3'}$ | = 10.888477 pF |
| $C_{A'}$ | = 10.329666 pF |
| $C_{B'}$ | = 0.14705319 pF |

-continued

| | |
|---|---|
| $C_D'$ | = 0.5603896 pF |
| $C_E'$ | = 8.63077815 pF |

$C_s$ is then computed, one for each lattice section ($C_{s1}$ and $C_{s2}$):

$$C_s = \frac{C_m}{2}\left(1 - \frac{C_{bj}}{C_o}\right)$$

with $C_{b1}'$ = 50.3001707 pF for the left section, and
$C_{b3}'$ = 10.888477 pF for the right section.
Hence, $C_{s1}$ = −16190.6836 pF, and $C_{s2}$ = −2642.91419 pF.

Absorbing the capacitances $-C_{sj}$ into the lattice as explained before slightly lowers the crystal inductance from its design value, which are, therefore, scaled back to their design value by impedance scaling and capacitance transformation.

Figure 7:
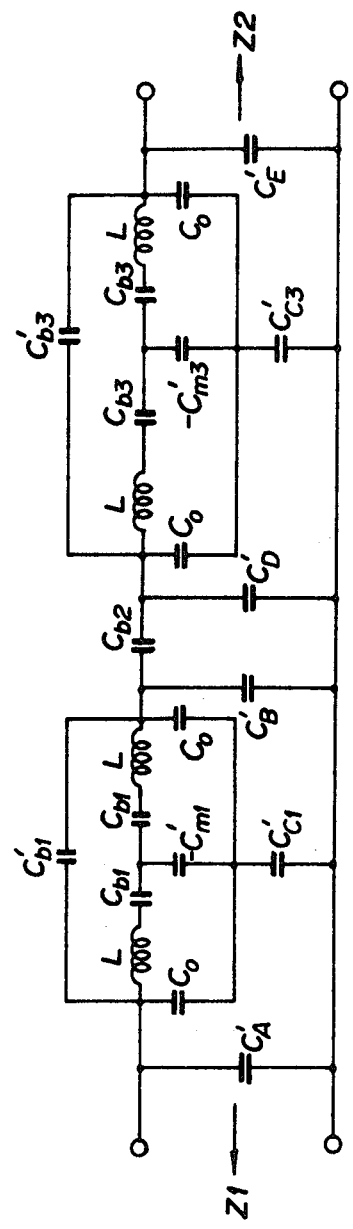
FIG. 7 is the final equivalent circuit of the composite filter according to the present invention.

From the formula $C_{bp} = \sqrt{(L/L_b)}\, C_o$ given before in conjunction with FIG. 6, the shunt capacitance $C_{bp}$ is computed for $C_o$ to be equal to the final design value 3.2 pF of the final circuit. The lattices are then unbalanced into bridged T's and the final circuit is obtained. The values of the elements in accordance with FIG. 7 are as follows:

| | |
|---|---|
| L | = 24.00 mH |
| $C_o$ | = 3.2 pF |
| $C_{b1}$ | = 0.01593184219 pF |
| $C_{b1}'$ | = 23.476907 pF |
| $C_{b2}$ | = 7.205404841 pF |
| $C_{b3}$ | = 0.1594053963 pF |
| $C_{b3}'$ | = 3.8283979 pF |
| $C_{m1}'$ | = 2200.0196 pF |
| $C_{m3}'$ | = 2202.3269 pF |
| $C_{c1}'$ | = 2193.1653 pF |
| $C_{c3}'$ | = 2193.165 pF |
| $C_A'$ | = 10.315262 pF |
| $C_B'$ | = 0.14238557 pF |
| $C_D'$ | = 0.533784952 pF |
| $C_E'$ | = 8.5191941 pF |
| $Z_1$ | = 599.42 ohms |
| $Z_2$ | = 22863.0 ohms |

The remaining crystal parameters are:

Mµ1: $K_1$ = 0.000724168193%; $f_1$ = 8139169 Hz.

Mµ2: $K_2$ = 0.0007238044306%; $f_2$ = 8136949 Hz.

FIG. 8 shows the schematic of the actual filter. Some of the capacitors are made variable to compensate for deviations from the calculated theoretical values. The component values are as given in the Figure. They do not differ substantially from the theoretical values.

What is claimed is:

1. A monolithic bandpass filter unit having an upper and a lower stopband comprising a monolithic piezoelectric crystal substrate having two adjacent electrodes on one surface thereof constituting two bilateral terminals of said filter unit, and a common electrode on the other surface opposite said two electrodes; a coupling capacitor between said two adjacent electrodes; and a capacitor interconnecting said one common electrode and a common terminal of said filter unit having a predetermined capacitance value to substantially cancel intra-crystal coupling in said monolithic piezoelectric crystal substrate, and to introduce a pair of finite poles in only one of said upper and lower stopbands of said monolithic bandpass filter unit.

2. The monolithic bandpass filter unit as defined in claim 1, said predetermined capacitance value being substantially equal in magnitude and opposite in algebraic sign to the capacitance representing said intra-crystal coupling, whereby said pair of finite poles is introduced in said lower stopband.

3. The monolithic bandpass filter unit of claim 1, said common electrode constituted of two electrically interconnected conductive pads each of which is coextensive with the opposite bilateral electrode.

4. The monolithic bandpass filter unit of claim 2, said common electrode constituted of two electrically interconnected conductive pads each of which is coextensive with the opposite bilateral electrode.

5. A polylithic filtering apparatus having an input and an output comprising a plurality of the filter units of claim 1, connected in tandem and having two predetermined capacitors connected in parallel one with said input and the other with said output.

6. A polylithic filtering apparatus having an input and an output comprising a plurality of the filter units of claim 2, connected in tandem and having two predetermined capacitors connected in parallel one with said input and the other with said output.

* * * * *